(12) United States Patent  
Takebayashi et al.

(10) Patent No.: US 11,869,790 B2  
(45) Date of Patent: Jan. 9, 2024

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yuji Takebayashi, Toyama (JP); Toshiro Koshimaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/957,048

(22) Filed: Sep. 30, 2022

(65) Prior Publication Data

US 2023/0307279 A1 Sep. 28, 2023

(30) Foreign Application Priority Data

Mar. 22, 2022 (JP) ................. 2022-046022

(51) Int. Cl.
*H01L 21/677* (2006.01)
*H01L 21/68* (2006.01)

(52) U.S. Cl.
CPC .. *H01L 21/67727* (2013.01); *H01L 21/67736* (2013.01); *H01L 21/68* (2013.01)

(58) Field of Classification Search
CPC ......... H01L 21/67727; H01L 21/76636; H01L 21/68; H01L 21/67718; H01L 21/6773; H01L 21/67775; H01L 21/6835; H01L 21/6836; H01L 21/67736
See application file for complete search history.

(56) References Cited

U.S. PATENT DOCUMENTS

| 5,443,346 A | 8/1995 | Murata et al. |
| 5,829,939 A * | 11/1998 | Iwai ................. H01L 21/67769 414/940 |
| 6,942,738 B1 * | 9/2005 | Nelson .............. H01L 21/68707 414/416.03 |
| 10,519,543 B2 * | 12/2019 | Hayashi ............ H01L 21/67757 |
| 2020/0098611 A1 * | 3/2020 | Kuwahara ......... H01L 21/67173 |
| 2022/0181174 A1 * | 6/2022 | Yamamoto ............. B23K 26/53 |

FOREIGN PATENT DOCUMENTS

| JP | H06-016206 A | 1/1994 |
| JP | 2004-071618 A | 3/2004 |
| JP | 2018-147952 A | 9/2018 |

* cited by examiner

*Primary Examiner* — Glenn F Myers

(74) *Attorney, Agent, or Firm* — Volpe Koenig

(57) ABSTRACT

There is provided a technique that includes: at least one process chamber configured to be capable of processing a substrate; one or more supports configured to be capable of supporting the substrate; a transporter configured to be capable of transporting the one or more supports; a transfer chamber configured to be capable of transferring the substrate; a transport chamber that is adjacent to the transfer chamber and the at least one process chamber and is configured to be capable of moving the transporter; and a delivery chamber that is disposed in the transport chamber and is configured to be capable of delivering the one or more supports.

15 Claims, 15 Drawing Sheets

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2022-046022, filed on Mar. 22, 2022, the entire contents of which are incorporated herein by reference.

TECHNICAL FIELD

The present disclosure relates to a substrate processing apparatus, a method of manufacturing a semiconductor device, and a recording medium.

BACKGROUND

In the related art, a batch-type substrate processing apparatus including a plurality of process chambers is known. In the batch-type substrate processing apparatus, it takes a long time to transport a substrate, and therefore, a technique was devised in which, instead of transporting a substrate, a substrate support stage on which a plurality of substrates are placed is transported and is loaded into a reaction furnace to process the substrates.

In the market, there is a demand for improvement in a transport efficiency in the technology of transporting a substrate to a process chamber by a transporter, transferring the substrate to the substrate support stage disposed in the process chamber by using a transfer, and then loading the substrate support stage into a reaction furnace to process the substrate.

SUMMARY

Some embodiments of the present disclosure provide a technique capable of improving a transport efficiency of a substrate.

According to embodiments of the present disclosure, there is provided a technique that includes: at least one process chamber configured to be capable of processing a substrate; one or more supports configured to be capable of supporting the substrate; a transporter configured to be capable of transporting the one or more supports; a transfer chamber configured to be capable of transferring the substrate; a transport chamber that is adjacent to the transfer chamber and the at least one process chamber and is configured to be capable of moving the transporter; and a delivery chamber that is disposed in the transport chamber and is configured to be capable of delivering the one or more supports.

BRIEF DESCRIPTION OF DRAWINGS

The accompanying drawings, which are incorporated in and constitute a portion of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the present disclosure will now be described with reference to the drawings. The drawings used in the following description are schematic, and dimensional relationships, ratios, and the like of various components shown in figures may not match actual ones. Further, dimensional relationships, ratios, and the like of various components among plural figures may not match one another.

<Substrate Processing Apparatus>

A substrate processing apparatus 20 of the embodiments of the present disclosure is a substrate processing apparatus including a vertical reaction furnace.

(Process Chamber)

Figure 1:
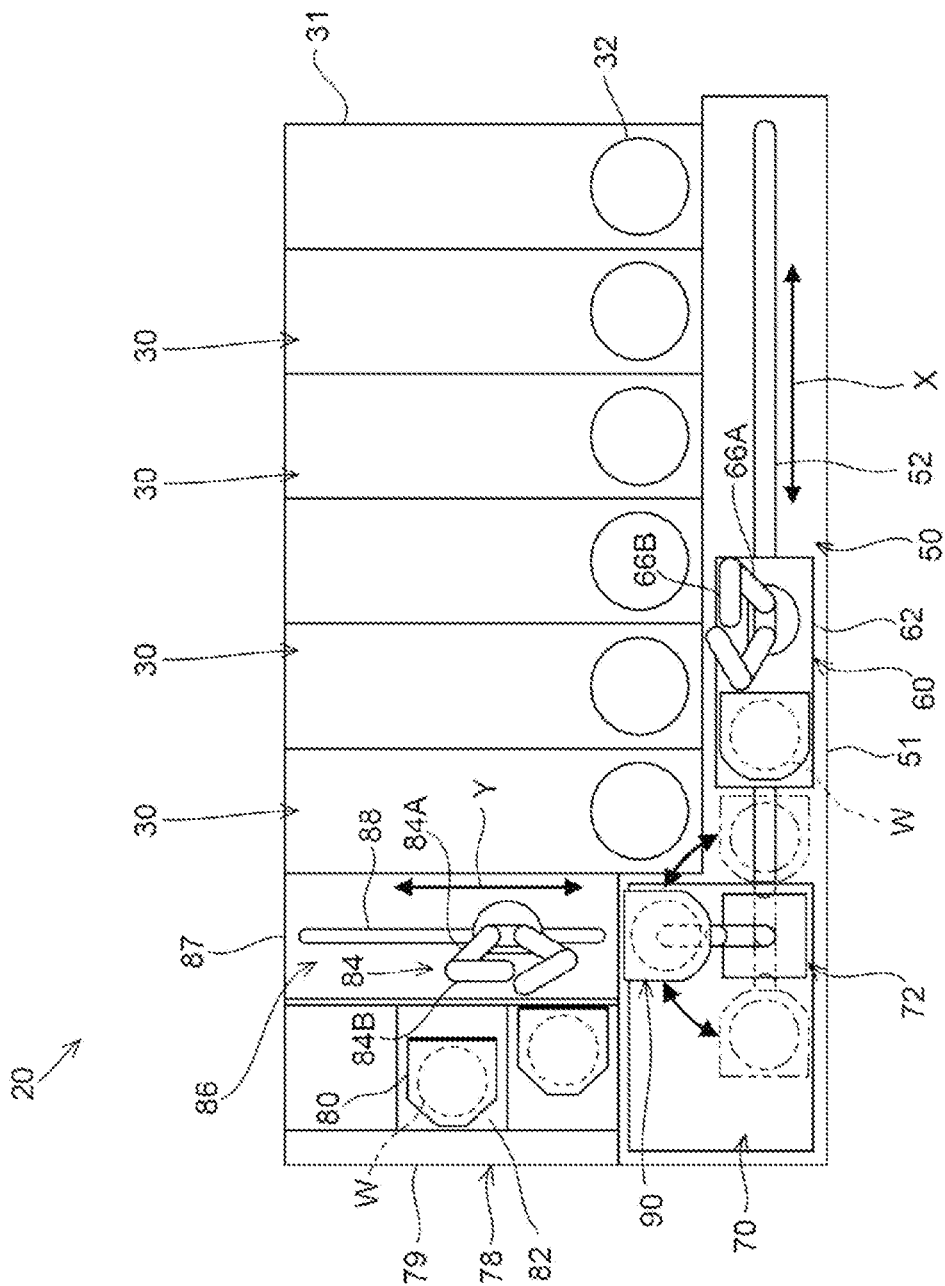
FIG. 1 is a schematic configuration view of a substrate processing apparatus according to embodiments of the present disclosure.
Figure 2:
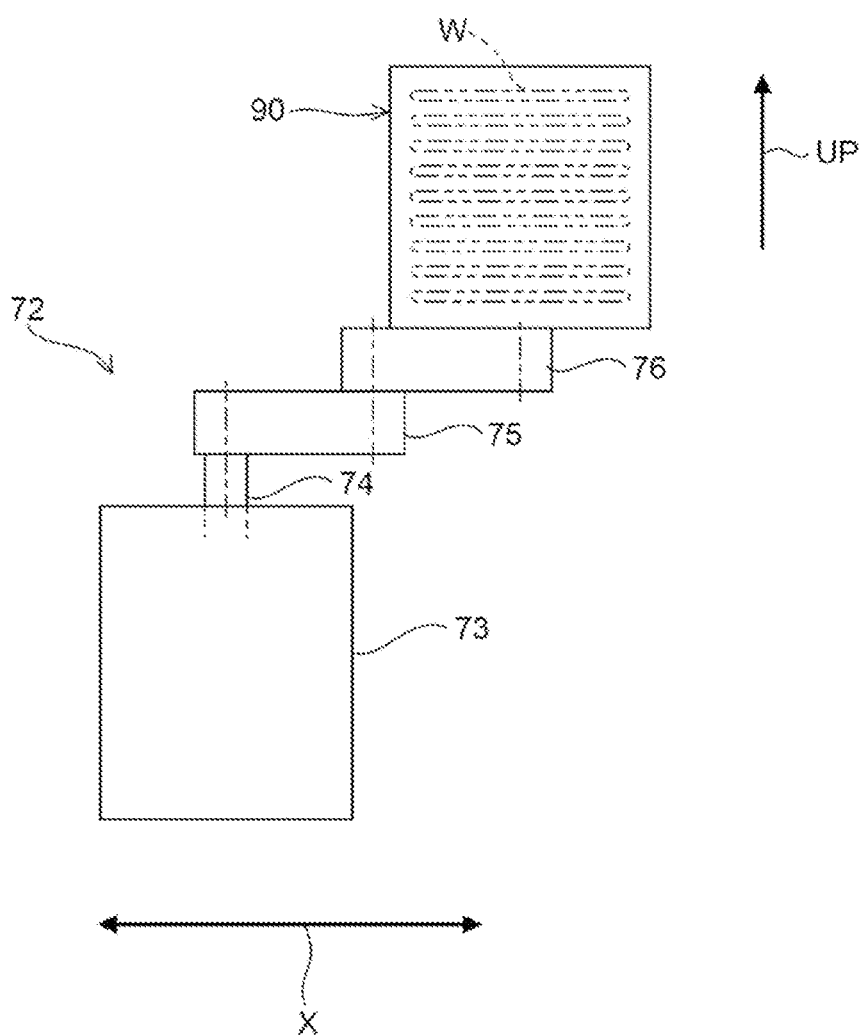
FIG. 2 is a side view showing a deliverer shown in FIG. 1.
Figure 3:
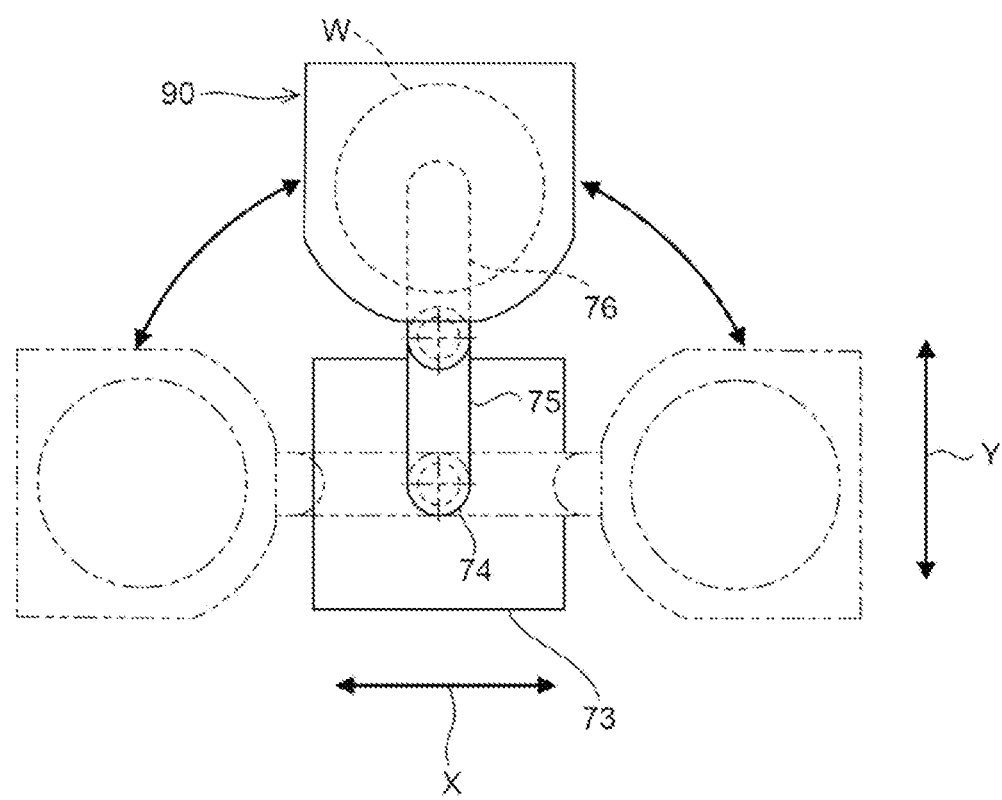
FIG. 3 is a plane view of the deliverer shown in FIG. 1.

The substrate processing apparatus 20 includes at least one process chamber 30, as shown in FIGS. 1 to 3. In the embodiments of the present disclosure, as an example, the substrate processing apparatus 20 includes six process chambers 30, but the present disclosure is not limited thereto.

The six process chambers 30 are horizontally arranged in a line as shown in FIG. 1. In the embodiments of the present disclosure, one housing 31 is partitioned to form the six process chambers 30, but the present disclosure is not limited thereto. For example, housings forming the process chambers 30 may be arranged in a line.

Further, the six process chambers 30 may independently process substrates W. That is, the six process chambers 30 are independently controlled by a controller 100, which will be described later.

The substrate W mentioned herein includes a product substrate, a dummy substrate, a monitor substrate, and the like. That is, the substrate W to be mounted on a substrate support stage 40 and the substrate W to be supported by a support 90 may be a product substrate, a dummy substrate, and a monitor substrate, and may be a mixture of them.

Figure 9:
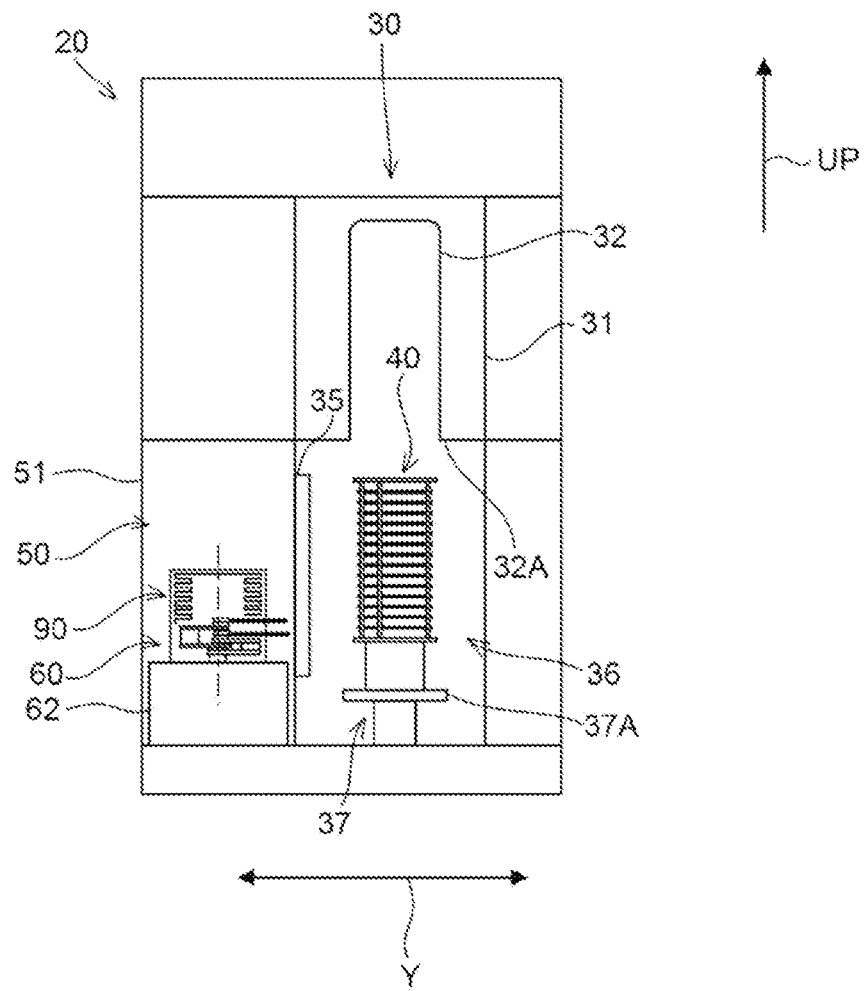
FIG. 9 is a schematic cross-sectional view of a process chamber in the substrate processing apparatus of FIG. 1.
Figure 10:
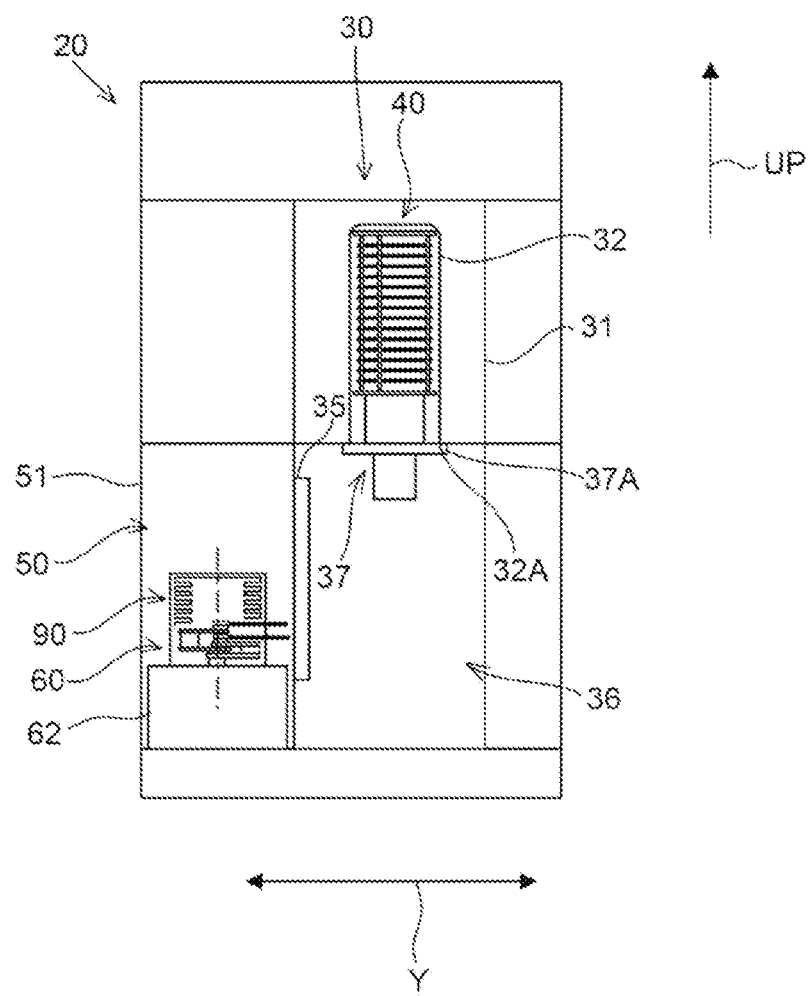
FIG. 10 is a schematic cross-sectional view of the process chamber in the substrate processing apparatus of FIG. 9, showing a state in which a substrate support stage is charged into a reaction furnace.
Figure 11:
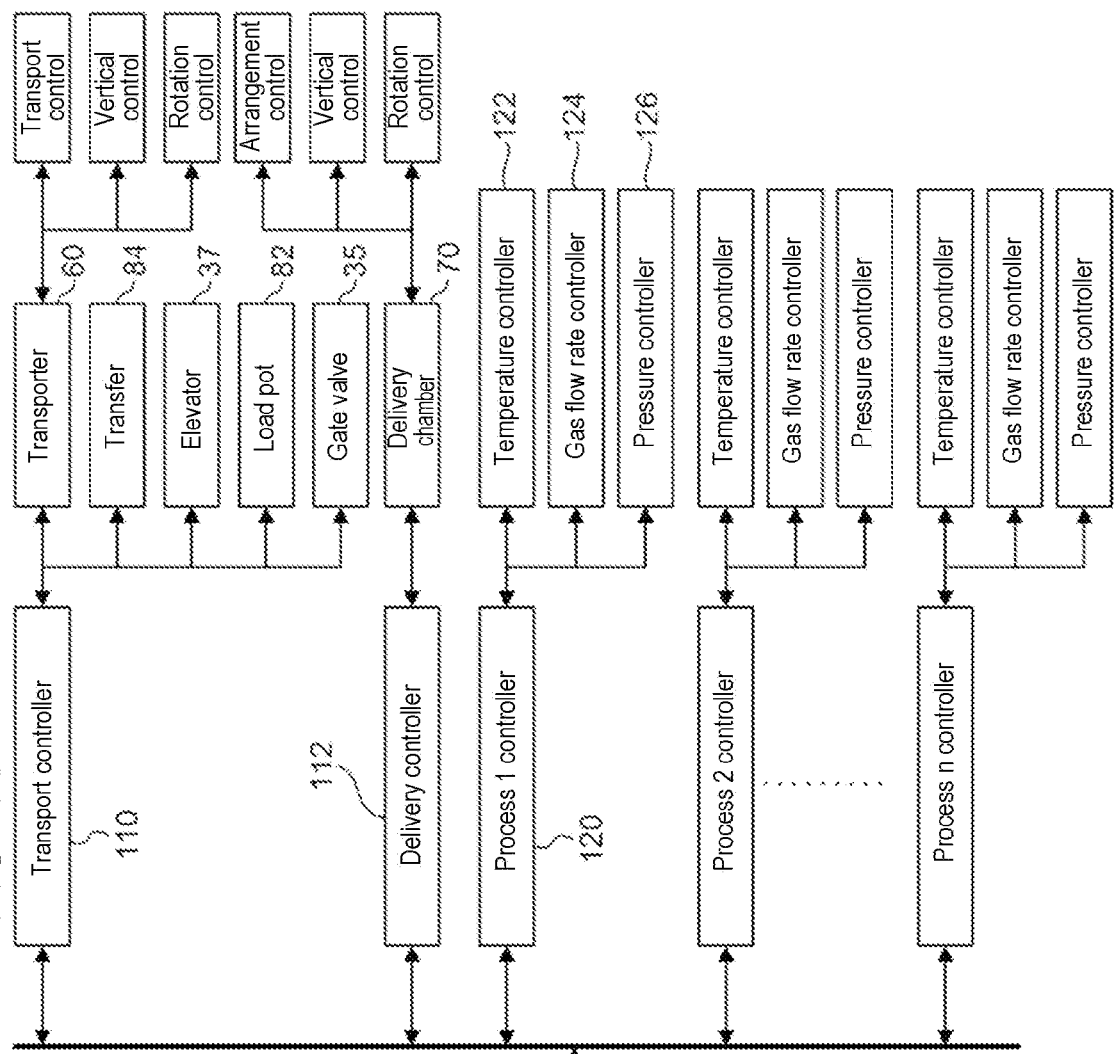
FIG. 11 is a diagram showing a configuration of a controller of the substrate processing apparatus according to embodiments of the present disclosure.

Each process chamber 30 includes a reaction furnace 32 as an example of a process container, as shown in FIGS. 9 and 10. This reaction furnace 32 is positioned in the upper portion of the process chamber 30. The substrate W is loaded into the reaction furnace 32. Specifically, the substrate support stage 40 supporting at least one substrate W is charged (loaded) into the reaction furnace 32. A gas supply system (not shown) configured to be capable of supplying a process gas, an inert gas, and the like into the reaction furnace 32 is connected to the reaction furnace 32. A predetermined amount of gas is supplied into the reaction furnace 32 by this gas supply system. Further, an exhaust system (not shown) configured to be capable of exhausting a process gas, an inert gas, and the like from the reaction furnace 32 is connected to the reaction furnace 32. The internal pressure of the reaction furnace 32 is regulated by this exhaust system. Further, a heater (not shown) configured to heat the reaction furnace 32 is disposed on an outer periphery of the reaction furnace 32. The internal temperature of the reaction furnace 32 is regulated by this heater. In the embodiments of the present disclosure, the gas supply system, the exhaust system, and the heater installed in the process chamber 30 are controlled by a temperature controller 122, a gas flow rate controller 124, and a pressure controller 126, respectively, as shown in FIG. 11. The temperature controller 122, the gas flow rate controller 124, and the pressure controller 126 are controlled by a controller 100, which will be described later.

The substrate W loaded into the reaction furnace 32 is heated by the heater in the reaction furnace 32 and is processed with the process gas supplied from the gas supply system. As a result, the substrate W is subjected to a film-forming process.

Further, the process chamber 30 includes a preparation chamber 36. The preparation chamber 36 is positioned in the lower portion of the process chamber 30. In other words, the preparation chamber 36 is positioned below the reaction furnace 32. The preparation chamber 36 is in fluid communication with an interior of the reaction furnace 32 via a furnace opening 32A of the reaction furnace 32. The preparation chamber 36 includes an elevator 37 to which the substrate support stage 40 is fixed. The elevator 37 moves the substrate support stage 40, which is fixed to an elevating stage 37A, upward together with the elevating stage 37A and charges the substrate support stage 40 into the reaction furnace 32. The peripheral portion of the elevating stage 37A is in contact with the peripheral portion of the furnace opening 32A of the reaction furnace 32 via a seal (not shown) to separate the interior of the reaction furnace 32 and the interior of the preparation chamber 36 from each other. Further, the elevator 37 performs a function of rotating the elevating stage 37A in the horizontal direction with the vertical direction as an axis.

The process chamber 30 includes an entrance (not shown) configured to be capable of taking the substrate W in and out. This entrance is opened/closed by a gate valve 35. The size of the entrance of the embodiments of the present disclosure is set so that the substrate W and a hand 66B and an extendable arm 66A of a transfer 66 supporting the substrate W may be taken in and out.

(Support)

Figure 6:
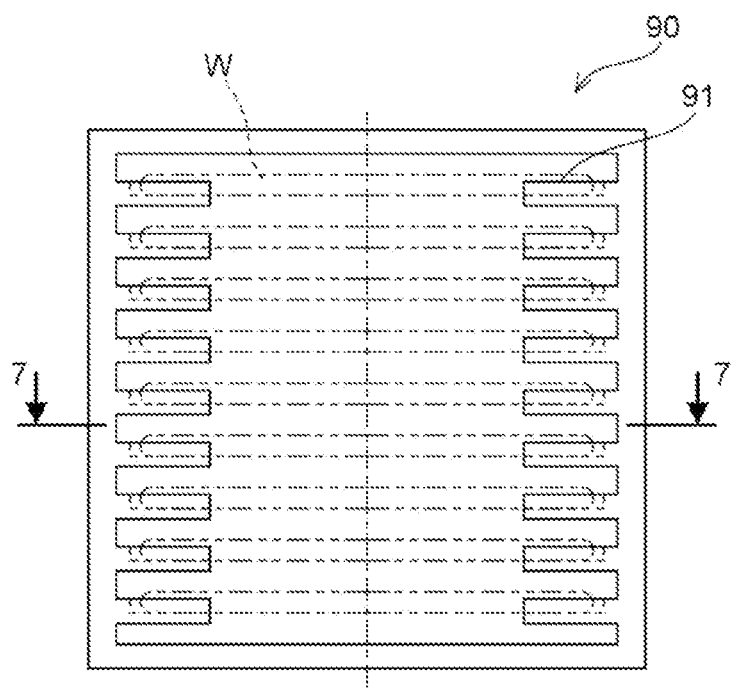
FIG. 6 is a front view of a support shown in FIG. 1.
Figure 8A:
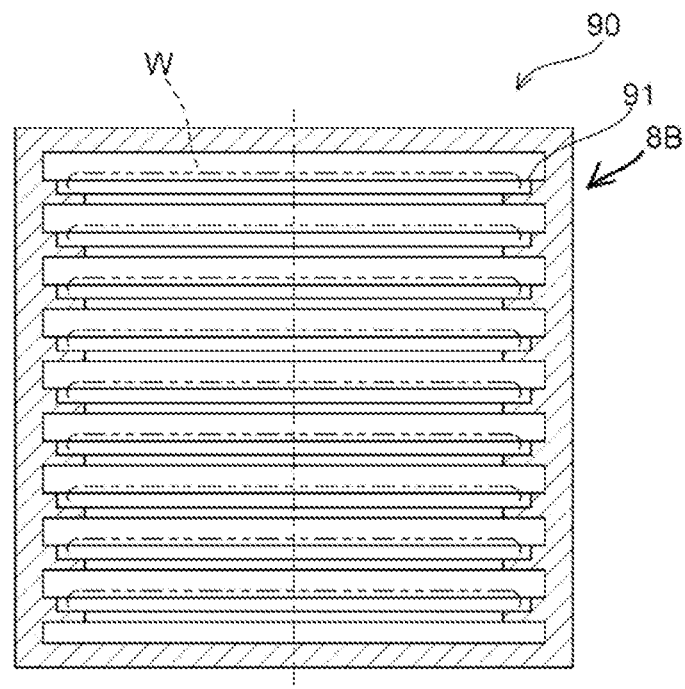
FIG. 8A is a cross-sectional view taken along line 8A-8A in FIG. 7.

The support 90 is configured to be capable of supporting at least one substrate W, as shown in FIGS. 6 and 8A. In the embodiments of the present disclosure, as an example, the support 90 is configured to be capable of supporting nine substrates W, but the present disclosure is not limited thereto. For example, the support 90 may support ten or more substrates W, or may support eight or less substrates.

Figure 7:
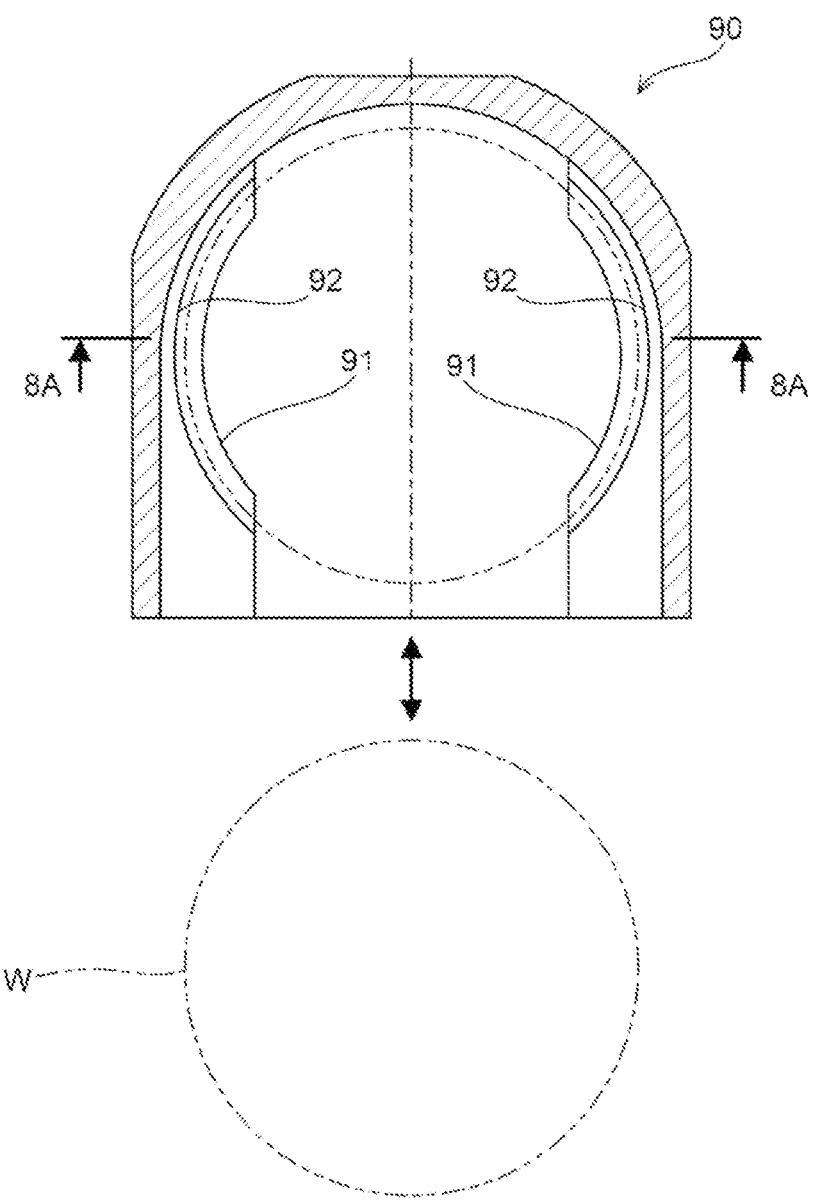
FIG. 7 is a cross-sectional view taken along line 7-7 in FIG. 6.
Figure 8B:
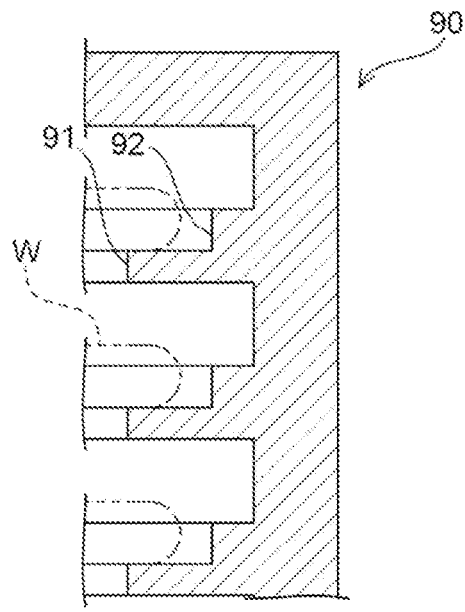
FIG. 8B is an enlarged view of a portion indicated by an arrow 8B in FIG. 8A.

As shown in FIGS. 7 and 8B, the support 90 includes a step 92 as an example of an aligner configured to be capable of preventing the substrate W from being misaligned. Specifically, protruding portions 91 protruding inward are formed on the inner walls on both sides of the support 90 respectively. These protruding portions 91 support the peripheral portion of the substrate W. Further, the step 92 is provided at an intermediate portion from a root to a tip of the protruding portions 91. Movement of the substrate W is restricted when the periphery of the substrate W comes into contact with the step 92. That is, the misalignment of the substrate W is prevented by the step 92.

(Transport Chamber)

The substrate processing apparatus 20 includes a transport chamber 50 including a transporter 60, as shown in FIGS. 1 and 9. The transport chamber 50 extends in a direction in which the six process chambers 30 are arranged. Further, the transport chamber 50 is adjacent to each of the process chambers 30 and the transfer chamber 86. The transport chamber 50 is in fluid communication with each process chamber 30 via the entrance of each process chamber 30. Housings 51 forming the transport chamber 50 are fixed to the housings 31 forming the process chamber 30. Further, an exhauster or the like configured to be capable of forming a vacuum atmosphere in the transport chamber 50 is connected to the transport chamber 50.

A rail 52 extending in a direction in which the six process chambers 30 are arranged is provided at a bottom surface of the transport chamber 50. The transporter 60 moves along this rail 52. Further, the transporter 60 transports the support 90 supporting the substrate W along the rails 52. Hereinafter, a direction in which the transporter 60 moves, that is, a direction in which the support 90 supporting the substrate W is transported is referred to as a substrate transport direction, as appropriate. The substrate transport direction is a direction indicated by arrow X in FIG. 1. Further, a direction indicated by arrow UP in FIG. 9 represents the vertical direction upward.

(Transporter)

The transporter 60 is configured to be capable of moving along the rail 52 in the transport chamber 50, as shown in FIG. 1. Further, the transporter 60 transports the support 90. The transporter 60 is controlled by the controller 100 to move toward the target process chamber 30.

Figure 4:
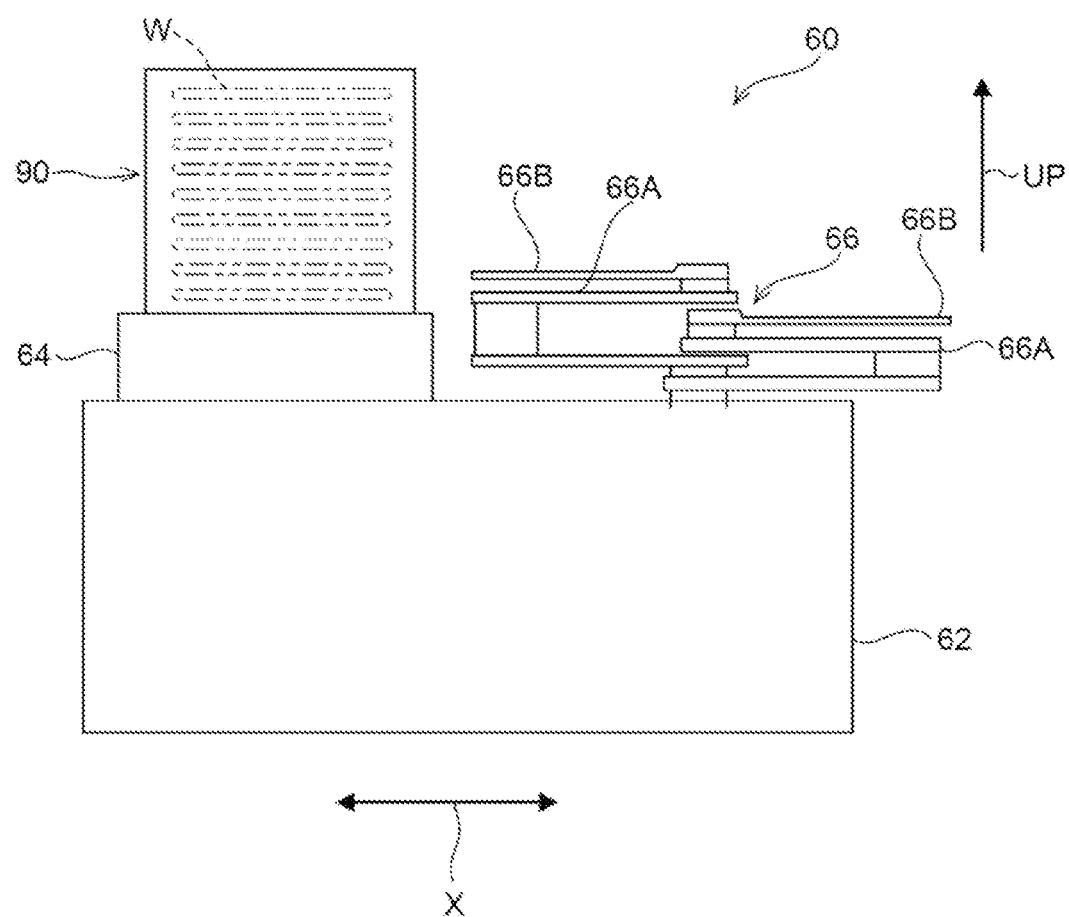
FIG. 4 is a side view of a transporter shown in FIG. 1.
Figure 5:
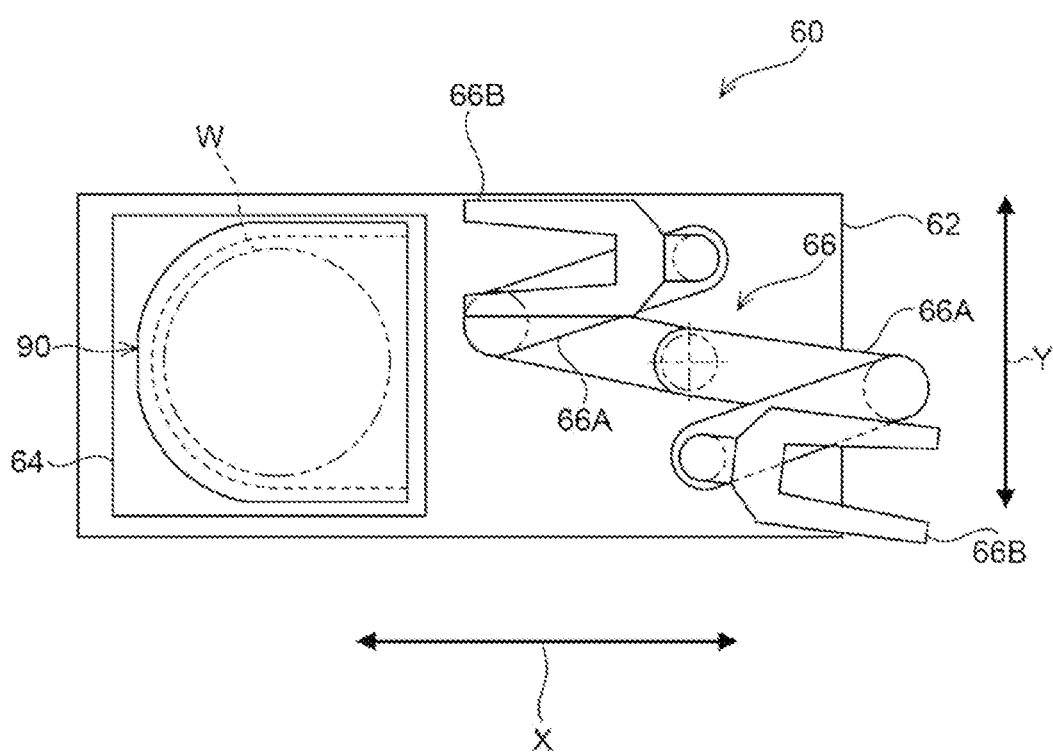
FIG. 5 is a plane view of the transporter shown in FIG. 1.

The transporter 60 includes a transfer stage 62, a mounting stage 64, and a transfer 66 as an example of a second transfer, as shown in FIGS. 4 and 5.

The transfer stage 62 is a pedestal that moves on the rail 52. A driver (not shown) configured to be capable of moving the transfer stage 62 along the rail 52 in the transfer direction is installed inside the transfer stage 62.

The mounting stage 64 is a pedestal on which the support 90 is mounted, and is provided at the upper portion of the transfer stage 62. The support 90 mounted on the mounting stage 64 is fixed to the mounting stage 64 by a fixture (not shown).

The transfer 66 is an apparatus capable of supporting at least one substrate W from the support 90 fixed to the mounting stage 64 and transferring the same to the substrate support stage 40 of the process chamber 30. The transfer 66 may also support at least one substrate W from the substrate support stage 40 of the process chamber 30 and transfer the same to the support 90.

The transfer 66 is provided adjacent to the mounting stage 64 above the transfer stage 62. The transfer 66 includes the extendable arm 66A and the hand 66B provided at the tip of the extendable arm 66A. The transfer 66 extends the extendable arm 66A and supports the substrate W from below with the hand 66B, such that the substrate W may be transferred from the support 90 to the substrate support stage 40, and from the substrate support stage 40 to the support 90. Further, the transfer 66 of the embodiments of the present disclosure includes a pair of extendable arms 66A provided with the hands 66B, but is not limited thereto. Further, the transfer 66 may move up or down with respect to the transfer stage 62. In other words, the transporter 60 includes an elevator (not shown) configured to be capable of moving up or down the transfer 66.

The substrate processing apparatus 20 includes a load port 82 on which an accommodating container 80 is mounted, and a transfer 84 as an example of a first transfer, as shown in FIG. 1.

The accommodating container 80 is a container that may accommodate at least one substrate W and may be delivered to the outside. As an example, the accommodating container 80 may be a front opening unified pod (FOUP), but is not limited thereto. Further, a product substrate, a dummy substrate, a monitor substrate, and the like, as the substrate W, are accommodated in each accommodating container 80.

The load port 82 is a pedestal on which the accommodating container 80 may be mounted. As an example, in the embodiments of the present disclosure, three load ports 82 are arranged in a row in a direction orthogonal to the substrate transport direction in a plane view of the substrate processing apparatus 20, but is not limited thereto. The number of load ports 82 may be more than three, or may be two or less.

Further, in the embodiments of the present disclosure, the accommodating container 80 and the load port 82 are arranged inside an accommodating chamber 78. The accommodating chamber 78 is formed by a housing 79.

The transfer 84 may transfer at least one substrate W and transfer the substrate W between the accommodating container 80 placed on the load port 82 and the transport chamber 50 (a delivery chamber 70). Specifically, the transfer 84 performs a function of taking out the substrate W from the accommodating container 80 mounted on the load port 82 and transferring the same to the support 90 and a function of taking out the substrate W from the support 90 and transferring the same to the accommodating container 80.

(Transfer Chamber)

As shown in FIG. 1, the substrate processing apparatus 20 includes the transfer chamber 86 extending in a direction orthogonal to the substrate transfer direction in the plane view of the substrate processing apparatus 20. Further, the direction orthogonal to the substrate transport direction is appropriately referred to as a substrate transfer direction. In FIG. 1, the substrate transfer direction is indicated by an arrow Y.

The transfer chamber 86 is a chamber in which the substrate W may be transferred, and contains the transfer 84. The transfer chamber 86 is located between the accommodating chamber 78 and the process chamber 30. One side surface of a housing 87 constituting the transfer chamber 86 is connected to the housing 31 of the process chamber 30. The other side surface of the housing 87 is provided with the entrances (not shown) for the substrates W at positions corresponding to the three load ports 82, respectively. These entrances are closed by shutters (not shown). A vacuum apparatus is connected to the transfer chamber 86 such that a state of vacuum may be adjusted.

A rail 88 extending in the substrate transfer direction is provided at the bottom surface of the transfer chamber 86. The transfer 84 moves on the rail 88.

The transfer 84 is installed on a moving stage (not shown) that moves on the rail 88. The transfer 84 includes an extendable arm 84A and a hand 84B provided at a tip of the extendable arm 84A. The transfer 84 extends the extensible arm 84A and supports the substrate W from below with the hand 84B, such that the substrate W may be transferred from the accommodating container 80 to the support 90, and from the support 90 to the accommodating container 80. Further, the transfer 84 of the embodiments of the present disclosure includes a pair of extendable arms 84A provided with the hands 84B, but is not limited thereto. Further, the transfer 84 may be moved up or down with respect to the moving stage. In other words, the moving stage includes an elevator (not shown) configured to be capable of moving up or down the transfer 84.

An operation of the transfer 84 that takes out the substrate W from the accommodating container 80 mounted on the load port 82 and transfers the same to the support 90 and an operation of the transfer 84 that takes out the substrate W from the support 90 and transfers the same to the accommodating container 80 are controlled by a transport controller 110 as an example of a transport controller. Further, the transfer 84 is controlled by the controller 100 as to which one of the substrates W accommodated in the three accommodating containers 80 is to be taken out.

(Delivery Chamber)

The substrate processing apparatus 20 includes a delivery chamber 70 disposed in the transport chamber 50 and configured to be capable of delivering a plurality of supports 90. As shown in FIG. 1, the delivery chamber 70 is disposed in a portion of the transport chamber 50 where the substrate W is transferred to and from the transfer chamber 86 in the plane view of the substrate processing apparatus 20.

As shown in FIGS. 1 to 3, the delivery chamber 70 includes a deliverer 72 configured to be capable of delivering the support 90 to and from the transporter 60.

The deliverer 72 includes a stage 73, a rotating extendable shaft 74, a rotating arm 75, and a holder 76.

The stage 73 is fixed to the bottom surface of the delivery chamber 70.

The rotating extendable shaft 74 is provided on the upper portion of the stage 73 and is rotatable about the vertical direction as an axis. Further, the rotating extendable shaft 74 is movable in the vertical direction with respect to the stage 73. Further, driver (not shown) that rotates the rotating extendable shaft 74 and an elevator (not shown) that vertically extends/contracts (moves up/down) the rotating extendable shaft 74 are arranged in the stage 73.

One end of the rotating arm 75 is fixed to the rotating extendable shaft 74. The holder 76 is attached to the other end of the rotating arm 75. This rotating arm 75 rotates around the rotating extendable shaft 74.

The holder 76 supports the support 90. Specifically, the holder 76 supports the lower surface of the support 90. In addition, in the embodiments of the present disclosure, the holder 76 is fixed to the support 90, as an example. As a result, the support 90 is held by the holder 76.

The deliverer 72 rotates the rotating extendable shaft 74 to move the support 90 held by the holder 76 among a transport position at which the support 90 is mounted on the mounting stage 64 of the transporter 60, a transfer position at which the substrate W is transferred to and from the transfer 84, and a standby position for temporary standby.

Further, the delivery chamber 70 includes a first supporter 77A (a portion indicated by a two-dot chain line in FIG. 19) that supports the support 90 when the support 90 is moved to the transfer position by the deliverer 72, and a second supporter 77B (a portion indicated by a two-dot chain line in FIG. 13) that supports the support 90 when the support 90 is moved to the standby position by the deliverer 72. Further, the second supporter 77B is also referred to as a standby supporter where the support 90 temporarily stands by.

The deliverer 72 is controlled by a delivery controller 112 as an example of a delivery controller. Specifically, a rotating driver and an elevator of the rotating extendable shaft 74 are controlled by the delivery controller 112. That is, arrangement control (position control), vertical control (elevation control), and rotation control of the support 90 by the deliverer 72 are controlled by the delivery controller 112. Further, the delivery controller 112 is controlled by the controller 100.

Further, as shown in FIG. 6, the deliverer 72 regulates the orientation of the support 90 so that the substrate W may be transferred to the transfer 84 when the support 90 is mounted on the first supporter 77A.

(Controller)

The substrate processing apparatus 20 includes the controller 100, as shown in FIG. 11. The controller 100 is configured as a computer including a CPU (Central Processing Unit) 101A, a RAM (Random Access Memory) 101B, a memory 101C, and an I/O port 101D.

The RAM 101B, the memory 101C, and the I/O port 101D are configured to be capable of exchanging data with the CPU 101A via an internal bus 101E. An input/output device 102 configured as, for example, a touch panel or the like is connected to the controller 100. Further, for example, a communicator 104 configured to be capable of communicating with a host apparatus is connected to the controller 100.

The memory 101C is configured by, for example, a flash memory, a hard disk drive (HDD), or the like. A control program that controls operations of the substrate processing apparatus, a process recipe in which sequences and conditions of substrate processing to be described later are written, and the like are readably stored in the memory 101C. The process recipe functions as a program that causes the controller 100 to execute each sequence in the substrate processing, which will be described later, to obtain a predetermined result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 101B is configured as a memory area (work area) in which programs or data read by the CPU 101A are temporarily stored.

The I/O port 101D is connected to the transport controller 110, the delivery controller 112, a plurality of process controllers 120, and the like. The transport controller 110 is a controller that controls the transport of the substrate W. The delivery controller 112 is a controller that controls the delivery of the substrate W. Each process controller 120 is a controller that controls a film-forming process of the substrate W. In the embodiments of the present disclosure, since the six process chambers 30 are provided, six process controllers 120 are provided corresponding to the respective process chambers 30. As a result, it is possible to perform the film-forming process independently for each process chamber 30.

The CPU 101A is configured to be capable of reading and executing the control program from the memory 101C. The CPU 101A is also configured to be capable of reading the recipe from the memory 101C according to an input of an operation command from the input/output device 102. The CPU 101A is configured to be capable of causing the transport controller 110 to control the transfer operation of the substrate W by the transfer 84, the elevator 37, and the transporter 60, the opening/closing operation of the gate valve 35 and the shutter, the positioning operation of the load port 82, and so on, according to contents of the read recipe. Further, the CPU 101A is configured to be capable of causing the delivery controller 112 to control the delivery operation and standby operation of the deliverer 72, and so on, according to contents of the read recipe.

Further, the CPU 101A is configured to be capable of causing the process controller 120 to control the temperature controller 122, the gas flow rate controller 124, and the pressure controller 126 according to contents of the read recipe. The temperature controller 122 is configured to be capable of controlling the temperature adjustment operation of the heater that heats the interior of the reaction furnace 32. The gas flow rate controller 124 is configured to be capable of controlling the flow rate adjustment operation of a gas supplied into the reaction furnace 32. The pressure controller 126 is configured to be capable of controlling the pressure adjustment operation within the reaction furnace 32.

The controller 100 may be configured by installing, on the computer, the aforementioned program stored in an external memory (for example, a magnetic disk such as a hard disk, an optical disc such as a CD, a magneto-optical disc such as a MO, or a semiconductor memory such as a USB memory) 103. The memory 101C or the external memory 103 is configured as a computer-readable recording medium. Hereinafter, the memory 101C and the external memory 103 may be generally and simply referred to as a "recording medium." When the term "recording medium" is used herein, it may indicate a case of including the memory 101C, a case of including the external memory 103, or a case of including both the memory 101C and the external memory 103. Furthermore, the program may be provided to the computer by using the Internet, a dedicated line, or the like, instead of using the external memory 103.

The controller 100 includes the transport controller 110 and the delivery controller 112 and is configured to be capable of controlling the transport controller 110 and the delivery controller 112 in accordance with the processing of the substrate W.

The transport controller 110 is configured to be capable of detecting whether or not the support 90 is mounted on the transporter 60 and controlling the transfer of the substrate W to the substrate support stage 40. The presence or absence of the support 90 mounted on the transporter 60 may be detected by, for example, detecting the presence or absence of the support 90 by using an optical sensor, detecting the presence or absence of the support 90 based on the mass of the support 90 by using a load cell, or detecting the presence or absence of the support 90 by analyzing image information acquired by a photographing apparatus such as a CCD camera, but the present disclosure is not limited thereto.

The delivery controller 112 is configured to be capable of managing whether or not the support 90 is mounted on the deliverer 72 and controlling the placement of the support 90. The presence or absence of the support 90 mounted on the deliverer 72 may be detected by, for example, detecting the presence or absence of the support 90 by using an optical sensor, detecting the presence or absence of the mounted support 90 based on the mass of the support 90 by using a load cell, or detecting the presence or absence of the support 90 by analyzing image information acquired by a photographing apparatus such as a CCD camera, but the present disclosure is not limited thereto.

The controller 100 may control the transfer of the transporter 60 between the delivery chamber 70 and the process chamber 30 and can also control the transfer of the transporter 60 between the process chamber 30 in which the substrate W was processed and another process chamber 30. That is, the controller 100 may transfer the substrate W between the delivery chamber 70 and the process chamber 30 by the transporter 60. The controller 100 may then control the transporter 60 to transfer the substrate W processed in the process chamber 30 to another process chamber 30. As a result, it is possible to process the substrate W via a plurality of process chambers 30.

<Method of Manufacturing Semiconductor Device>

Next, a method of manufacturing a semiconductor device by using the substrate processing apparatus 20 according to embodiments of the present disclosure, that is, a procedure of processing the substrate W, will be described. In the following description, the operation of each component constituting the substrate processing apparatus 20 is controlled by the controller 100.

<Support Movement: Standby Position→Transfer Position> (FIG. 12)

Figure 12:
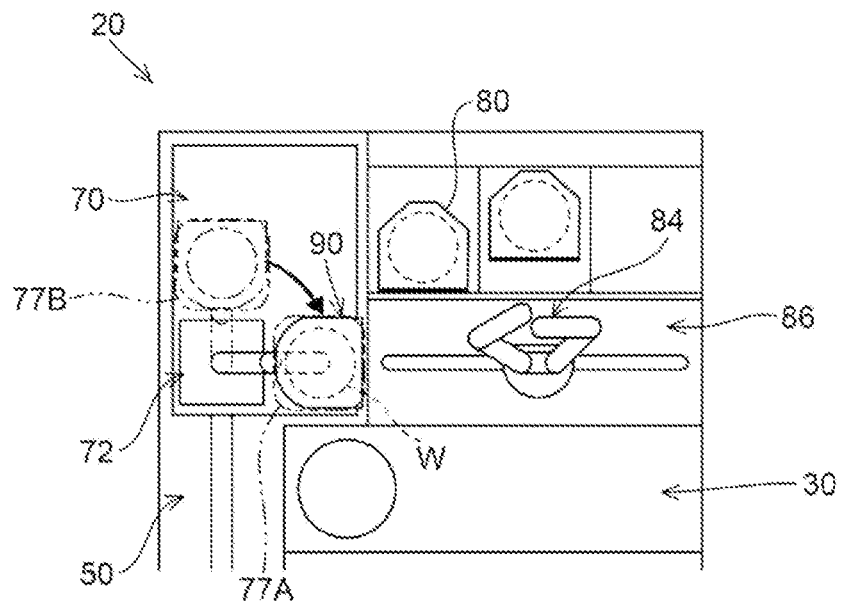
FIG. 12 is a schematic configuration view of a substrate processing apparatus that explains a method of manufacturing a semiconductor device according to embodiments of the present disclosure, showing a state in which a support is moved to a transfer position by a deliverer.

First, as shown in FIG. 12, the deliverer 72 holds the empty support 90 supported by the second supporter 77B. Next, the rotating extendable shaft 74 is rotated to rotate and move the support 90 from the standby position to the transfer position, such that the support 90 is supported by the first supporter 77A.

<Substrate Transfer: Accommodating Container→Support> (FIG. 13)

Figure 13:
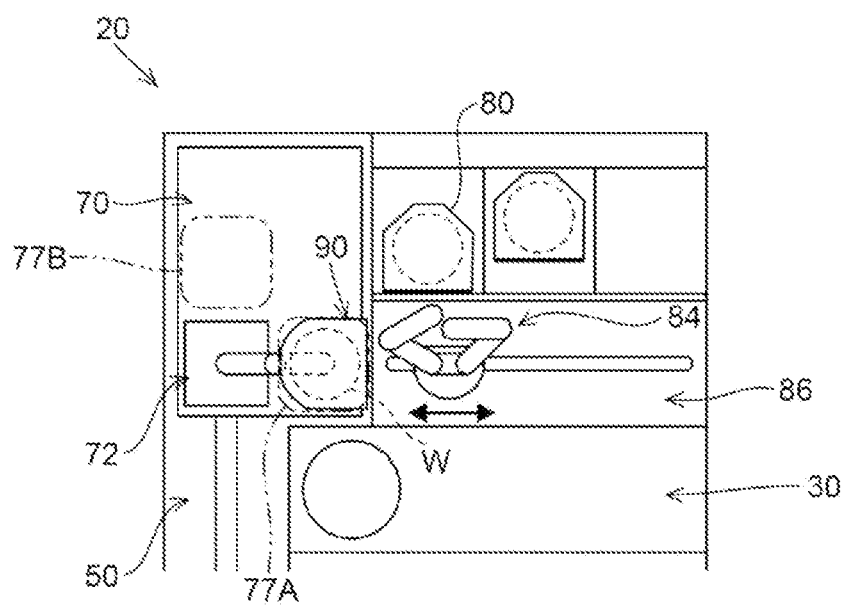
FIG. 13 shows a state in which a transfer (an example of a first transfer) transfers a substrate to the support at the transfer position in the schematic configuration view of the substrate processing apparatus of FIG. 12.

Next, as shown in FIG. 13, the transfer 84 is operated to transfer, as an example, nine substrates W from the accommodating container 80 to the support 90.

<Transporter Movement: Completion of Mounting Empty Support>

An empty support 90 is mounted on the transporter 60, and when the processing of the substrate W in one of the six process chambers 30 is completed, the transporter 60 on which the empty support 90 is mounted moves toward the process chamber 30 in which the processing of the substrate W was completed.

<Taking-Out of Processed Substrate from Process Chamber>

When the transporter 60 arrives in front of the target process chamber 30, the gate valve 35 of the target process chamber 30 is opened. At this time, the substrate support stage 40 taken out from the reaction furnace 32 is lowered in the preparation chamber 36 together with the elevating stage 37A of the elevator 37. After that, the transfer 66 is used to take out the processed substrate W from the substrate support stage 40 and cause the same to be supported by the empty support 90.

Figure 14:
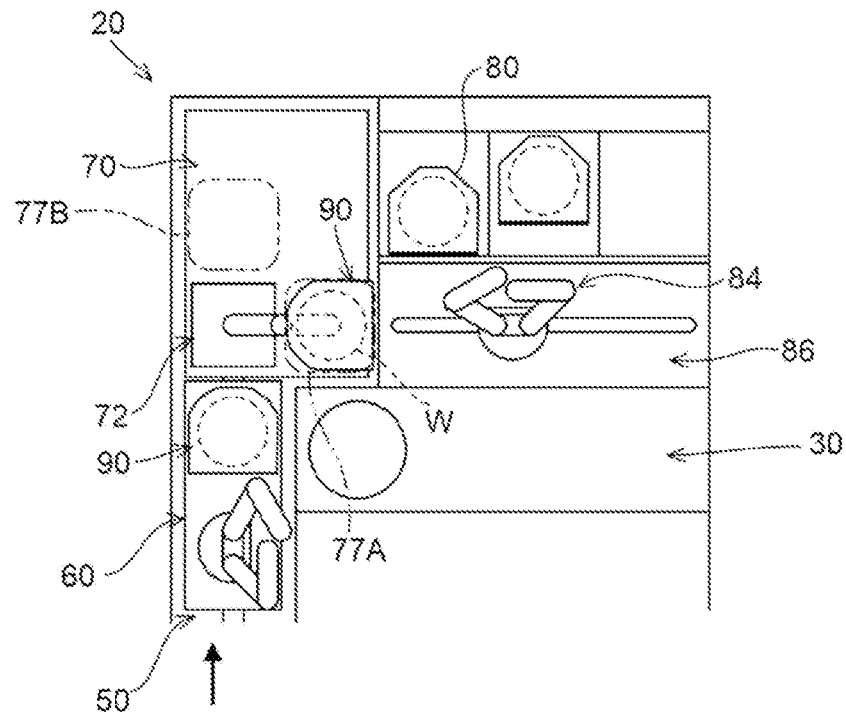
FIG. 14 shows a state in which a transporter transports the support supporting a processed substrate to the deliverer in the schematic configuration view of the substrate processing apparatus of FIG. 13.

<After Taking Out Processed Substrate, Moving Transporter to Delivery Chamber> (FIG. 14)

After transferring the processed substrate W from the substrate support stage 40 to the support 90, the transporter 60 with the support 90 mounted on the mounting stage 64 is moved toward the delivery chamber 70, as shown in FIG. 14.

<Movement of Support: Transfer Position→Standby Position> (FIG. 15)

Figure 15:
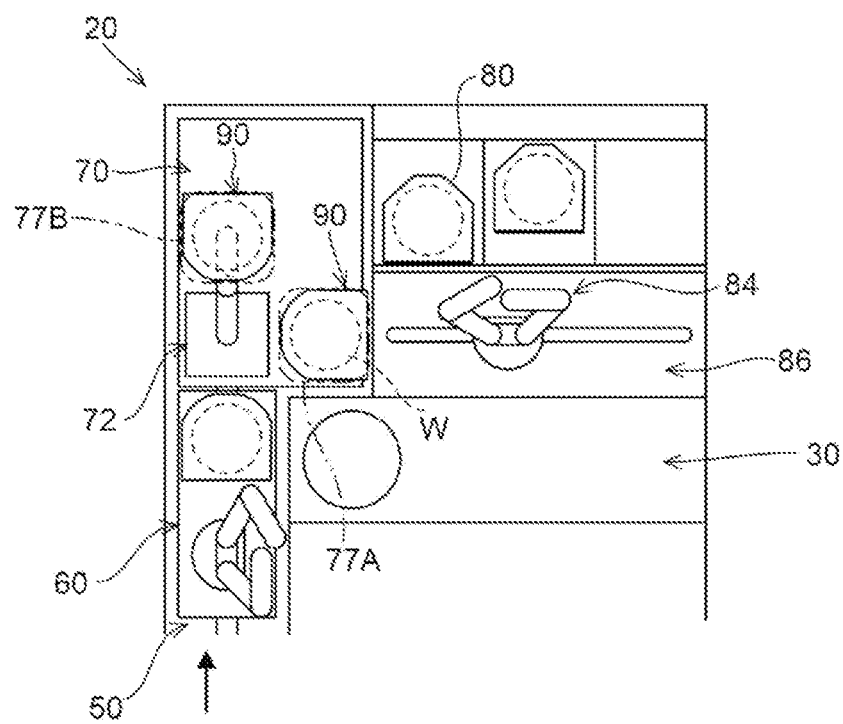
FIG. 15 shows a state in which the deliverer moves the support supporting a processed substrate to a standby position in the schematic configuration view of the substrate processing apparatus of FIG. 14.

Next, as shown in FIG. 15, the support 90 is moved from the transporter 60 to the standby position by the deliverer 72. Then, the support 90 supporting the processed substrate W is supported by the second supporter 77B.

<Movement of Support: Transfer Position→Transfer Position> (FIG. 16)

Figure 16:
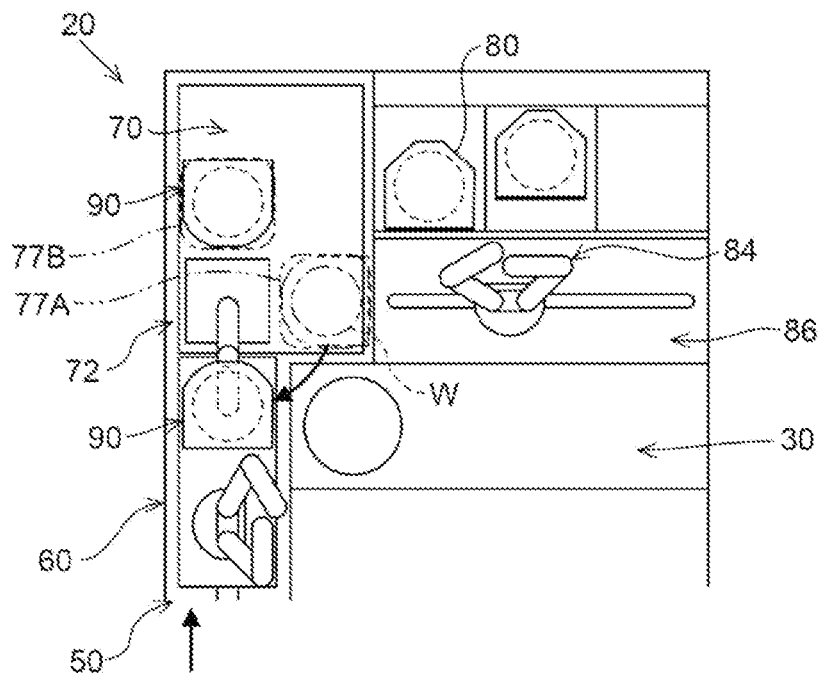
FIG. 16 shows a state in which the deliverer transfers the support at the transfer position to the transporter in the schematic configuration view of the substrate processing apparatus of FIG. 15.

Next, as shown in FIG. 16, the support 90 is moved from the first supporter 77A to the transfer position by the deliverer 72. Then, the support 90 supporting an unprocessed substrate W is supported by the mounting stage 64.

Figure 17:
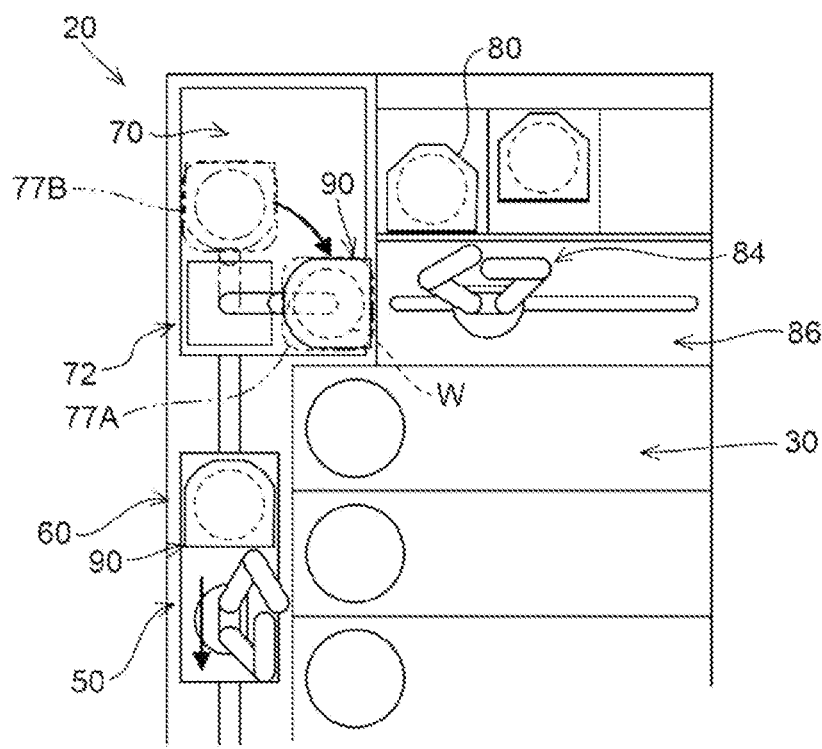
FIG. 17 shows a state in which the transporter is moving toward a target process chamber in the schematic configuration view of the substrate processing apparatus of FIG. 16.

<Moving Transporter with Support Supporting Unprocessed Substrate Mounted> (FIG. 17)

When the support 90 is mounted on the mounting stage 64, the transporter 60 is moved to the target process chamber 30, as shown in FIG. 17. That is, the support 90 is transported to the target process chamber 30 by the transporter 60.

<Gate Valve Open of Process Chamber>

Then, when the transporter 60 reaches the target process chamber 30, the gate valve 35 of the target process chamber 30 for loading is opened.

<Transferring of Substrate to Substrate Support Stage>

After the gate valve 35 is opened, the transfer 66 of the transporter 60 is used to transfer the unprocessed substrate W on the support 90 to the substrate support stage 40 (see FIG. 9). When the transfer of the substrate W from the transporter 60 to the substrate support stage 40 is completed, the gate valve 35 is closed, the substrate support stage 40 is lifted together with the elevating stage 37A of the elevator 37, and the substrate support stage 40 is charged into the reaction furnace 32 (see FIG. 10).

After the substrate support stage 40 is charged into the reaction furnace 32, a process gas, an inert gas, etc. are supplied while controlling the internal pressure and internal temperature of the reaction furnace 32. As a result, the substrate W is subjected to a film-forming process.

After the transporter 60 is moved to the target process chamber 30, the support 90 supporting the processed substrate W, which is supported in the second supporter 77B by the deliverer 72, is moved to the first supporter 77A (see FIG. 17).

Figure 18:
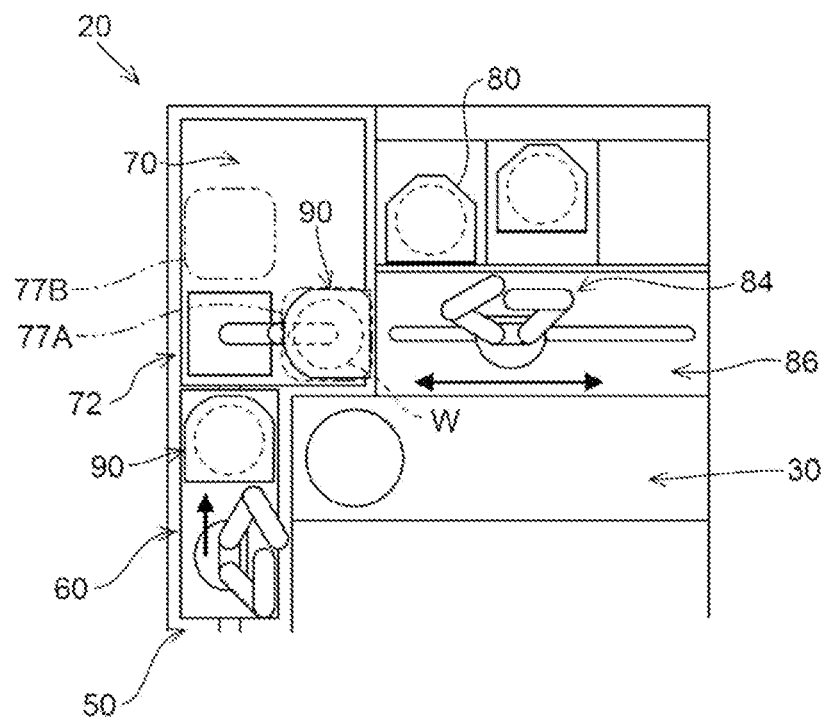
FIG. 18 shows a state in which the transfer (an example of the first transfer) transfers the substrate from the support supporting the processed substrate at the transfer position to an accommodating container in the schematic configuration view of the substrate processing apparatus of FIG. 17.

The processed substrate W is transferred from the support 90 moved to the first supporter 77A to the accommodating container 80 by the transfer 84 (see FIG. 18).

Figure 19:
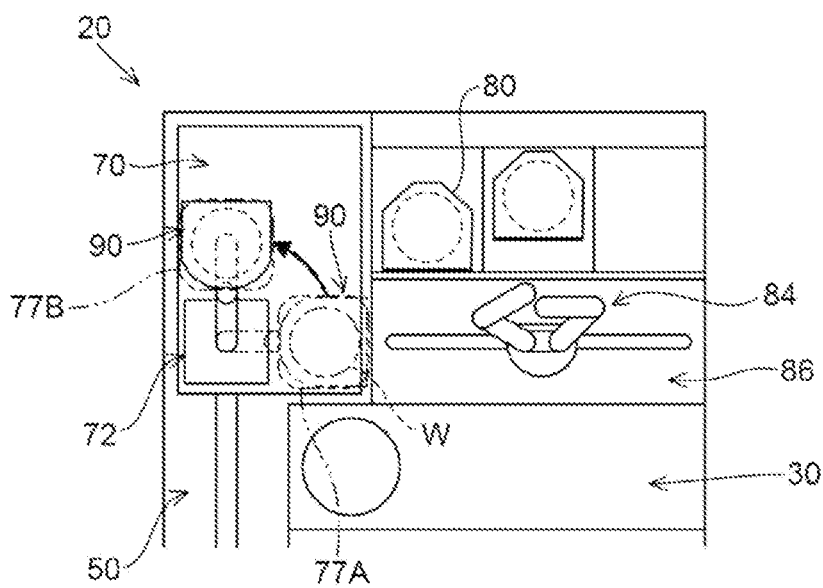
FIG. 19 shows a state in which the deliverer moves an empty support at the transfer position to the standby position in the schematic configuration view of the substrate processing apparatus of FIG. 18.

Then, after the processed substrate W is transferred to the accommodating container 80, the empty support 90 is moved from the first supporter 77A to the second supporter 77B by the deliverer 72 (see FIG. 19). In a case where the unprocessed substrate W is supported by the support 90 immediately after the processed substrate W is transferred to the accommodating container 80, the unprocessed substrate W may be immediately supported by the support 90 without causing the unprocessed substrate W to stand by at the second supporter 77B.

In this way, the film-forming process of the substrate W is performed to manufacture the semiconductor device.

Next, operations and effects of the embodiments of the present disclosure will be described. In the embodiments of the present disclosure, since the delivery chamber 70 where a plurality of supports 90 may be transferred is disposed in the transport chamber 50 where the transporter 60 may be moved, the plurality of supports 90 may be handled at the same time, which may contribute to the improvement of production efficiency. In addition, by delivering the plurality of supports 90 in the delivery chamber 70, it is possible to avoid the transport rate-limiting of the substrate W. Further, when a plurality of substrates W are supported by the support 90, the plurality of substrates W may be transported at once, which may contribute to shortening the substrate transport time. That is, in the embodiments of the present disclosure, it is possible to improve the transport efficiency of the substrate W.

In the embodiments of the present disclosure, the controller 100 is configured to be capable of controlling the transport controller 110 and the delivery controller 112 in accordance with the processing of the substrate W. Therefore, when the controller 100 manages the transport controller 110 and the delivery controller 112, arrangement timing of the support 90 becomes clear, thereby facilitating management of a production schedule.

In the embodiments of the present disclosure, since the transport controller 110 is configured to be capable of detecting whether or not the support 90 is mounted on the transporter 60 and controlling the transfer of the substrate W, reliable management of movement of the support 90 to the target process chamber 30 may be performed, and the transfer of the substrate W to the substrate support stage 40 may be reliably performed.

In the embodiments of the present disclosure, since the delivery controller 112 is configured to be capable of managing whether or not the support 90 is mounted and controlling the arrangement of the support 90, it is possible to avoid the transport rate-limiting when a plurality of supports 90 are handled. Further, the support 90 may be disposed at an appropriate position at an appropriate timing.

In the embodiments of the present disclosure, the transfer 84 is configured to be capable of transferring at least one substrate W between the accommodating container 80 mounted on the load port 82 and the support 90. Here, there are a plurality of load ports 82, and a plurality of accommodating containers 80 may be mounted on the plurality of load ports 82, respectively. Further, the support 90 may transfer at least one substrate W from at least one accommodating container 80.

In the embodiments of the present disclosure, since the support 90 may support at least one type of substrate W, the substrate W to be processed may be transported regardless of the type of substrate, which may contribute to shortening the transfer time.

In the embodiments of the present disclosure, the transporter 60 may transport the support 90 mounted on the mounting stage 64, that is, may transport a plurality of substrates W supported by the support 90 at once, which may contribute to shortening the transport time of the substrate W.

In the embodiments of the present disclosure, since the transfer 66 included in the transporter 60 may transfer at least one substrate W supported by the support 90 to the process chamber 30, it is possible to transfer the substrate W to the support 90 and the process chamber 30 even in a narrow space by the extendable arm 66A of the transfer 66. Further, there are two hands 66B, and it is possible to transfer the substrate W in units of two, which may contribute to shortening the substrate transfer time.

In the embodiments of the present disclosure, since the delivery chamber 70 may deliver the support 90 supporting the processed substrate W and the support 90 supporting the unprocessed substrate W, a plurality of supports 90 may be handled, thereby improving an efficiency of substrate transfer.

In the embodiments of the present disclosure, the support 90 delivered from the transporter 60 is supported in one side of the delivery chamber 70, and the support 90 delivered from the transfer chamber 86 is supported in the other side of the delivery chamber 70. Therefore, by arranging a plurality of supports 90 at the target position, it is possible to avoid the transfer rate-limiting of the support 90.

In the embodiments of the present disclosure, since the delivery chamber 70 includes the second supporter 77B as the standby supporter where the support 90 may stand by, by temporarily disposing the support 90 at the standby position, it is possible to avoid the transfer rate-limiting of the support 90.

In the embodiments of the present disclosure, when the delivery chamber 70 delivers the support 90, the deliverer 72 may regulate the orientation of the opening surface of the substrate W such that the substrate W may be transferred, which may contribute to the reduction of the transfer time of the substrate W.

In the embodiments of the present disclosure, since the support 90 includes the step 92 as the aligner capable of preventing the misalignment of the substrate W, it is possible to prevent the substrate W from being misaligned during the transport. Further, by preventing the misalignment of the substrate W, it is possible to prevent contact between the transfer 66/the transfer 84 and the substrate W when the substrate W is transferred.

Other Embodiments

The present disclosure is not limited to the above-described embodiments, and may be modified in various ways without departing from the gist of the present disclosure. For example, in the deliverer 72, the support 90 is supported from below, but the support 90 may be suspended from above.

According to the present disclosure in some embodiments, it is possible to improve a transfer efficiency of a substrate.

While certain embodiments are described above, these embodiments are presented herein by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    at least one process chamber configured to be capable of processing a substrate;
    one or more supports configured to be capable of supporting the substrate;
    a transporter configured to be capable of transporting the one or more supports;
    a transfer chamber configured to be capable of transferring the substrate;
    a transport chamber that is adjacent to the transfer chamber and the at least one process chamber and is configured to be capable of moving the transporter; and
    a delivery chamber configured to be capable of delivering the one or more supports,
    wherein the delivery chamber includes at least two supporters, and
    wherein the delivery chamber is configured such that a support of the one or more supports, which has been delivered from the transporter, is supported by one supporter of the at least two supporters, and a support of the one or more supports is supported by another supporter of the at least two supporters to allow the substrate to be transferred.

2. The substrate processing apparatus of claim 1, further comprising:
    a controller configured to be capable of controlling the processing of the substrate;
    a transport controller configured to be capable of controlling the transporter; and
    a delivery controller configured to be capable of controlling the delivery chamber,
    wherein the controller is configured to be capable of controlling the transport controller and the delivery controller according to the processing of the substrate.

3. The substrate processing apparatus of claim 2, wherein the transport controller is configured to be capable of detecting whether or not the one or more supports are mounted on the transporter and controlling the transfer of the substrate.

4. The substrate processing apparatus of claim 2, wherein the delivery controller is configured to be capable of managing whether or not the one or more supports are mounted and controlling the mounting of the one or more supports.

5. The substrate processing apparatus of claim 1, further comprising:
    a load port configured to be capable of mounting thereon an accommodating container configured to be capable of being delivered externally and accommodating the substrate; and
    a first transfer that is disposed in the transfer chamber and is configured to be capable of transferring the substrate,
    wherein the first transfer is further configured to be capable of transferring the substrate between the accommodating container mounted on the load port and the one or more supports.

6. The substrate processing apparatus of claim 1, wherein the substrate includes a plurality of substrates,
    wherein the substrate processing apparatus further comprises:
        a load port configured to be capable of mounting thereon an accommodating container configured to be capable of being delivered externally and accommodating the plurality of substrates; and
        a first transfer that is disposed in the transfer chamber and is configured to be capable of transferring the plurality of substrates, and
    wherein the first transfer is further configured to be capable of transferring the plurality of substrates between the accommodating container mounted on the load port and the one or more supports.

7. The substrate processing apparatus of claim 1, wherein the substrate includes plural types of substrates, and
    wherein the one or more supports are configured to be capable of supporting at least one selected from the group of the plural types of substrates.

8. The substrate processing apparatus of claim 1, wherein the transporter includes a mounting stage on which the one or more supports are mounted, and is configured to be capable of transporting the one or more supports mounted on the mounting stage.

9. The substrate processing apparatus of claim 1, wherein the transporter includes a second transfer capable of transferring the substrate, and
    wherein the second transfer is configured to be capable of transferring the substrate supported by the one or more supports to the at least one process chamber.

10. The substrate processing apparatus of claim 1, wherein the substrate includes a plurality of substrates, and
    wherein the delivery chamber is configured to be capable of delivering a support of the one or more supports that supports a processed substrate of the plurality of substrates and a support of the one or more supports that supports an unprocessed substrate of the plurality of substrates.

11. The substrate processing apparatus of claim 1, wherein the delivery chamber includes a standby supporter in which the one or more supports are capable of standing by.

12. The substrate processing apparatus of claim 1, wherein the delivery chamber includes a deliverer configured to be capable of regulating an orientation of a substrate transfer surface so that the substrate is transferrable when the one or more supports are delivered.

13. The substrate processing apparatus of claim 1, wherein the one or more supports include an aligner configured to be capable of preventing misalignment of the substrate.

14. A method of manufacturing a semiconductor device that is performed by the substrate processing apparatus of claim 1, the method comprising:
    transporting, by the transporter, the one or more supports to the at least one process chamber;
    transferring the substrate from the supports to a substrate support stage that is loaded into the at least one process chamber;
    processing the substrate in the at least one process chamber; and delivering, in the delivery chamber, the supports such that:
  a support of the one or more supports, which has been delivered from the transporter, is supported by one supporter of the at least two supporters; and
  a support of the one or more supports is supported by another supporter of the at least two supporters to allow the substrate to be transferred.

15. A non-transitory computer-readable recording medium storing a program that is capable of causing, by a computer, the substrate processing apparatus of claim 1 to perform a process comprising:
  transporting, by the transporter, the one or more supports to the at least one process chamber;
  transferring the substrate from the supports to a substrate support stage that is loaded into the at least one process chamber;
  processing the substrate in the at least one process chamber; and
  delivering, in the delivery chamber, the supports such that:
    a support of the one or more supports, which has been delivered from the transporter, is supported by one supporter of the at least two supporters; and
    a support of the one or more supports is supported by another supporter of the at least two supporters to allow the substrate to be transferred.

* * * * *